(12) United States Patent
Dobbek et al.

(10) Patent No.: US 8,117,248 B2
(45) Date of Patent: Feb. 14, 2012

(54) DIGITAL FILTER INSTRUCTION AND FILTER IMPLEMENTING THE FILTER INSTRUCTION

(75) Inventors: Jeffrey J. Dobbek, Morgan Hill, CA (US); Kirk Hwang, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1643 days.

(21) Appl. No.: 11/067,962

(22) Filed: Feb. 28, 2005

(65) Prior Publication Data
US 2006/0195498 A1    Aug. 31, 2006

(51) Int. Cl.
*G06F 17/10* (2006.01)

(52) U.S. Cl. ......... 708/300; 708/271; 708/303; 708/309

(58) Field of Classification Search .................. None
See application file for complete search history.

(56) References Cited

U.S. PATENT DOCUMENTS

| | | | | |
|---|---|---|---|---|
| 4,554,642 A * | 11/1985 | Rubin | ............................ | 708/300 |
| 5,179,530 A | 1/1993 | Genusov et al. | | |
| 6,519,106 B1 | 2/2003 | Goh et al. | | |
| 7,461,113 B2 * | 12/2008 | Reesor | ............................ | 708/319 |
| 2002/0118479 A1 | 8/2002 | Yoshizawa et al. | | |
| 2003/0110347 A1 | 6/2003 | Henderson et al. | | |

FOREIGN PATENT DOCUMENTS

| | | |
|---|---|---|
| EP | 0438991 A1 | 7/1991 |
| WO | WO 02/12999 A2 | 2/2002 |

OTHER PUBLICATIONS

Oct. 1995, Thomas G.Homer, TMS320 DSP Designer's Notebook: "Using the Circular Buffers on the TMS320C5x", No. 68, pp. 68-1 to 68-6.
Fall 2003, Fred. J. Taylor, "FIR Examples: Lesson No. 11", http://www.hsdal.ufl.edu/Projects/dtsigs/lessons/Ch5_FIR2.doc, 7 pages.
Mar. 2001, TMS320C54x DSP Reference Set, vol. 2: Mnemonic Instruction Set, http://focus.ti.com/lit/ug/spru172c.pdf, p. 4-59.
May 2003, LSI Logic: "User's Guide, ZSP™ Software Development Kit", Revision 4.3.1, http://www.zsp.com/pdf/zspprocessorsdk_brief.pdf, pp. E-8 to E-13.
Jun. 2000, Dipa Rao, Texas Instruments: "Circular Buffering on TMS320C6000", http://www.eetkorea.com/ARTICLES/2001MAY/2001MAY21_DSP_AN7,PDF, 14 pages.

(Continued)

*Primary Examiner* — Lewis Bullock, Jr.
*Assistant Examiner* — Michael Yaary
(74) *Attorney, Agent, or Firm* — Merchant & Gould (57) ABSTRACT

A digital filter instruction and filter implementing the filter instruction are disclosed. The filter instruction synthesizes a digital filter and includes an instruction field, a tap length field, a coefficient address field, a data header address field, a clear accumulator bit and an update bit. The filter instruction a concise instruction format to significantly decrease memory required, allow for instruction pipelining without branch penalty, and uses a circular buffer for the data so the data address pointer is only needed to be updated for the next input sample. The filter instruction may be used to implement FIR or IIR filters by using the options of pre-clear accumulator or pre/post storing accumulator results.

39 Claims, 7 Drawing Sheets

OTHER PUBLICATIONS

Chi-Kuang Chen et al: "A Digital Signal Processor With Programmable Correlator Array Architecture for Third Generation Wireless Communication System," IEEE Transactions on Circuits and Systems—II: Analog and Digital Signal Processing, vol. 48, No. 12. Dec. 2001.

"TMS320C55x DSP Mnemonic Instruction Set Reference Guide" Oct. 2002, Texas Instruments, XP002421641, pp. 5-152-pp. 5-155.

"TM-1300 Media Processor Data Book" May 30, 2000, Philips Semiconductors, XP002421738, pp. A-83-pp. A-85, pp. A-172-pp. A-173.

* cited by examiner

DIGITAL FILTER INSTRUCTION AND FILTER IMPLEMENTING THE FILTER INSTRUCTION

BACKGROUND OF THE INVENTION

1. Field of the Invention

This invention relates in general to data signal detection in a data channel or servo system, and more particularly to a digital filter instruction and filter implementing the filter instruction.

2. Description of Related Art

Recently developed data storage devices, such as magnetic disk drive devices (i.e., hard disk drives), have increased storage capacity and increased data access speed. With these advantages, magnetic disk drive devices have become widely used as auxiliary memory devices for computer systems. More generally, developments in pulse communications related to these improvements in disk drive technology have recently provided increased speed and reliability in a wide range of pulse communications systems. The present invention will be described in detail in the context of magnetic disk drive devices, but persons skilled in the pulse communications arts will readily apprehend that this invention provides an improved method for data pulse detection in a wide variety of pulse communication contexts.

The primary features of a magnetic disk drive device that affect storage capacity and access speed are the head, the recording medium, the servo mechanism, the signal processing technique used in the read/write channel, and the like. Among these, signal processing techniques utilizing PRML (Partial Response Maximum Likelihood) detection have greatly contributed to the increased storage capacities and high access speeds seen in modern magnetic disk drive devices.

A read channel circuit in a generic read/write channel circuit of a magnetic disk drive device includes components for initial processing of the analog read signal generated by the read/write head of the device. This processing provides automatic gain control (AGC) amplification, filtering, and equalization, as well as analog-to-digital conversion.

As areal densities increase, inter-symbol interference (ISI), transition-dependent noise and non-linear distortions at high densities and bandwidth limitations at high data rates lead to performance degradation. For example, the level of inter-symbol interference between neighboring recorded bits in magnetic recording channels increases with recording density. The read-write channels that are currently most commonly used are based on the partial response approach. In this approach, the channel impulse and a Viterbi detector are used for detecting the data pulses in the digitized read signal and recovering the bits.

For example, a common problem encountered when electronically reading or transmitting data is that it becomes corrupted by such things as background noise, impulse noise, fades, etc. Usually this data corruption is statistical phenomenon, which causes additive and/or multiplicative transformations to the originally transmitted data. Thus, the original data undergoes changes such as frequency translation, non-linear or harmonic distortion, and time dispersion. In addition, high speed data transmission over channels of limited bandwidth results in a type of distortion commonly referred to as intersymbol interference.

In the field of signal processing, waveform shaping, removal of noise components and extraction of desired signal components are carried out in order to correctly perform desired signal processing. Such processing is carried out through filters. Filters are classified into an FIR (Finite Impulse Response) filters and IIR (Infinite Impulse Response) filters. A FIR filter computes sequential output data using only old sequential input data, the influence of the sequential input data's determined impulse response on sequential output data is limited to finite time. Since the IIR filter feeds old sequential output data back to the input side and treats this data as new sequential input data to compute sequential output data, the influence of the impulse response of the sequential input data on the sequential output data extends to infinite time. The FIR filter and IIR filter are used for the same purpose. Although the IIR filter has higher performance, the design is difficult and the structure is complicated. In this respect, the FIR filter is used more widely.

Digital signal processing devices (DSP) are relatively well known. DSPs generally are distinguished from general purpose microprocessors in that DSPs typically support accelerated arithmetic operations by including a dedicated multiplier and accumulator (MAC) for performing multiplication of digital numbers. The instruction set for a typical DSP device usually includes a MAC instruction for performing multiplication of new operands and addition with a prior accumulated value stored within an accumulator register.

A digital filter may be implemented by programming the DSPs with instructions to implement the filter function. However, a program for carrying out data processing includes instructions other than those for carrying out the filter processing itself. With a digital filter that is formed by a processor basic operational instructions are those for an addition, a subtraction and a multiplication, and hence the number of the instructions is increased. The mathematical algorithm for a typical finite impulse response (FIR) filter may look like the equation $$Y_n = h_0 X_n + h_1 X_{n-1} + h_2 X_{n-2} + \ldots + h_{m-1} X_{n-M-1}$$

where $h_m$ are M fixed filter coefficients numbering from 0 to M−1 and $X_n$ are the data samples. The equation $Y_n$ may be evaluated by using a software program. However in some applications, it is necessary that the equation be evaluated as fast as possible. One way to do this is to perform the computations using hardware components such as a DSP device programmed to compute the equation $Y_n$.

A digital filter processes digital signals in discrete time and is normally implemented through digital electronic computation using a digital signal processor (DSP). A DSP is a specialized microprocessor designed specifically for digital signal processing generally in real-time. DSPs usually have an instruction set optimized for the task of rapid signal processing such as multiply-accumulate, which computes a product and adds it to an accumulator. An instruction set, or instruction set architecture (ISA), is a specification detailing the commands that a computer's CPU should be able to understand and execute, or the set of all commands implemented by a particular CPU design.

While a digital filter algorithm may be implemented in a digital signal processor (DSP), such implementation often takes longer execution times, requires the sizeable code spaces, and has overhead of shifting the data at address x(n−1) to the next higher address in data memory to make certain that the input sequence x(n) is in the correct location for the next pass through the filter.

It can be seen then that there is a need for a digital filter instruction and filter implementing the filter instruction.

SUMMARY OF THE INVENTION

To overcome the limitations in the prior art described above, and to overcome other limitations that will become apparent upon reading and understanding the present specification, the present invention discloses a digital filter instruction and filter implementing the filter instruction.

The present invention solves the above-described problems by providing a filter instruction with a concise instruction format to significantly decrease memory required, allow for instruction pipelining without branch penalty, and uses the circular buffer for the data so the data address pointer is only needed to be updated for the next input sample. The filter instruction may be used to implement FIR or IIR filters by using the options of pre-clear accumulator or pre/post storing accumulator results.

A read filter instruction for synthesizing a digital filter in accordance with the principles of an embodiment of the present invention includes an instruction field, a tap length field, a coefficient address field, a data header address field, a clear accumulator bit and an update bit.

In another embodiment of the present invention, an apparatus is provided. The apparatus includes a processor having registers, the processor configured to implement a digital filter based upon a filter instruction, addressable memory coupled to the processor for storing input, coefficient and output data, the addressable memory configured as a circular buffer and a filter instruction executable on the processor to implement the digital filter, the filter instruction comprising an instruction field, a tap length field, a coefficient address field, a data header address field, a clear accumulator bit and an update bit.

In another embodiment of the present invention, a magnetic storage device is provided. The magnetic storage device includes a magnetic storage medium for recording data thereon, a motor for moving the magnetic storage medium, a head for reading and writing data on the magnetic storage medium, an actuator for positioning the head relative to the magnetic storage medium and a data channel for processing encoded signals on the magnetic storage medium, the data channel including a processor having registers, the processor configured to implement a digital filter based upon a filter instruction and addressable memory coupled to the processor for storing input, coefficient and output data, the addressable memory configured as a circular buffer, wherein the processor is configurable to provide a digital filter according to a filter instruction, the filter instruction comprising an instruction field, a tap length field, a coefficient address field, a data header address field, a clear accumulator bit and an update bit.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a digital filter instruction and filter implementing the filter instruction. A filter instruction according to an embodiment of the present invention solves these issues with a concise instruction format to significantly decrease memory required, allow for instruction pipelining without branch penalty, and uses the circular buffer for the data so the data address pointer is only needed to be updated for the next input sample. The filter instruction may be used to implement FIR or IIR filters by using the options of pre-clear accumulator or pre/post storing accumulator results.

Figure 1:
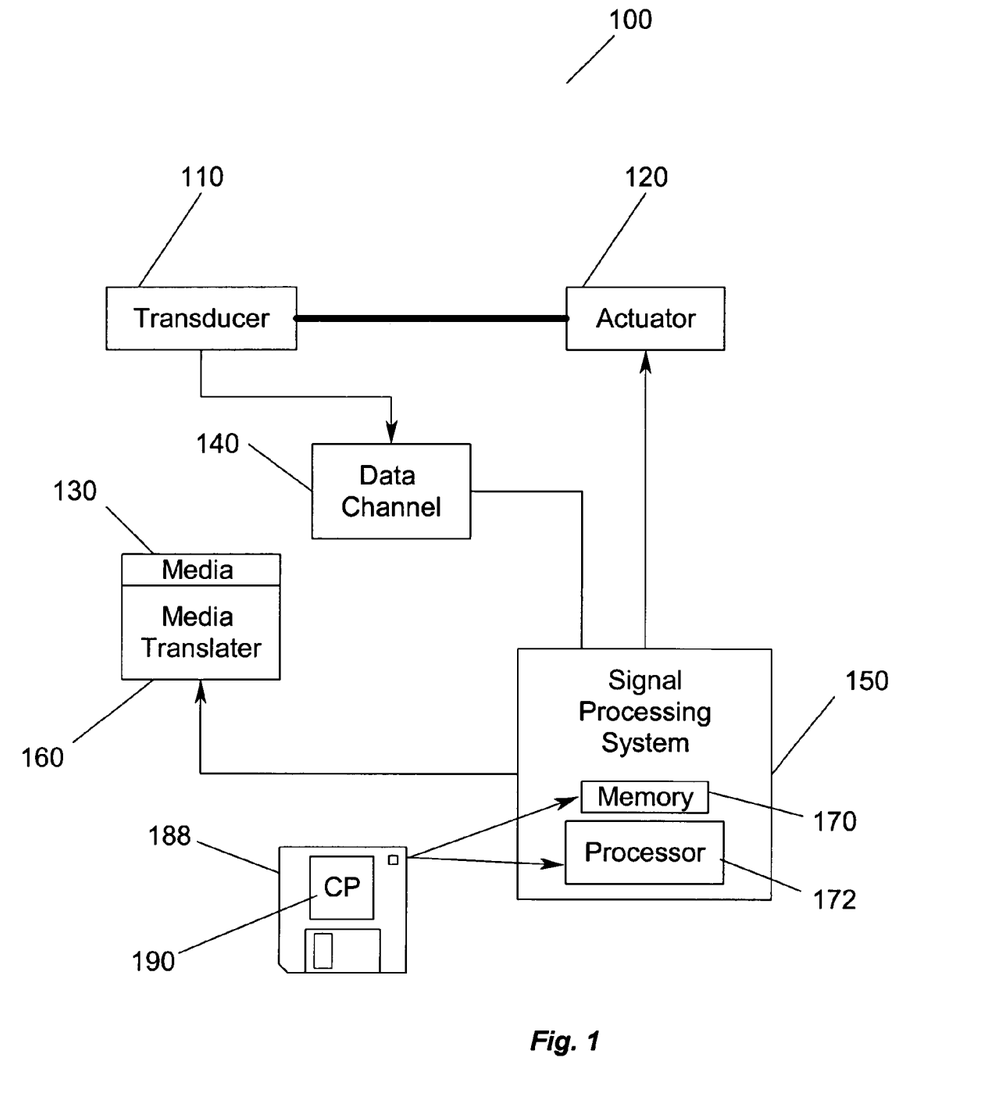
FIG. 1 illustrates a storage system according to an embodiment of the present invention.

FIG. 1 illustrates a storage system 100 according to an embodiment of the present invention. In FIG. 1, a transducer 110 is under control of an actuator 120. The actuator 120 controls the position of the transducer 110. The transducer 110 writes and reads data on magnetic media 130. The read/write signals are passed to a data channel 140. A signal processor system 150 controls the actuator 120 and processes the signals of the data channel 140. In addition, a media translator 160 is controlled by the signal processor system 150 to cause the magnetic media 130 to move relative to the transducer 110. Nevertheless, the present invention is not meant to be limited to a particular type of storage system 100 or to the type of media 130 used in the storage system 100.

Figure 2:
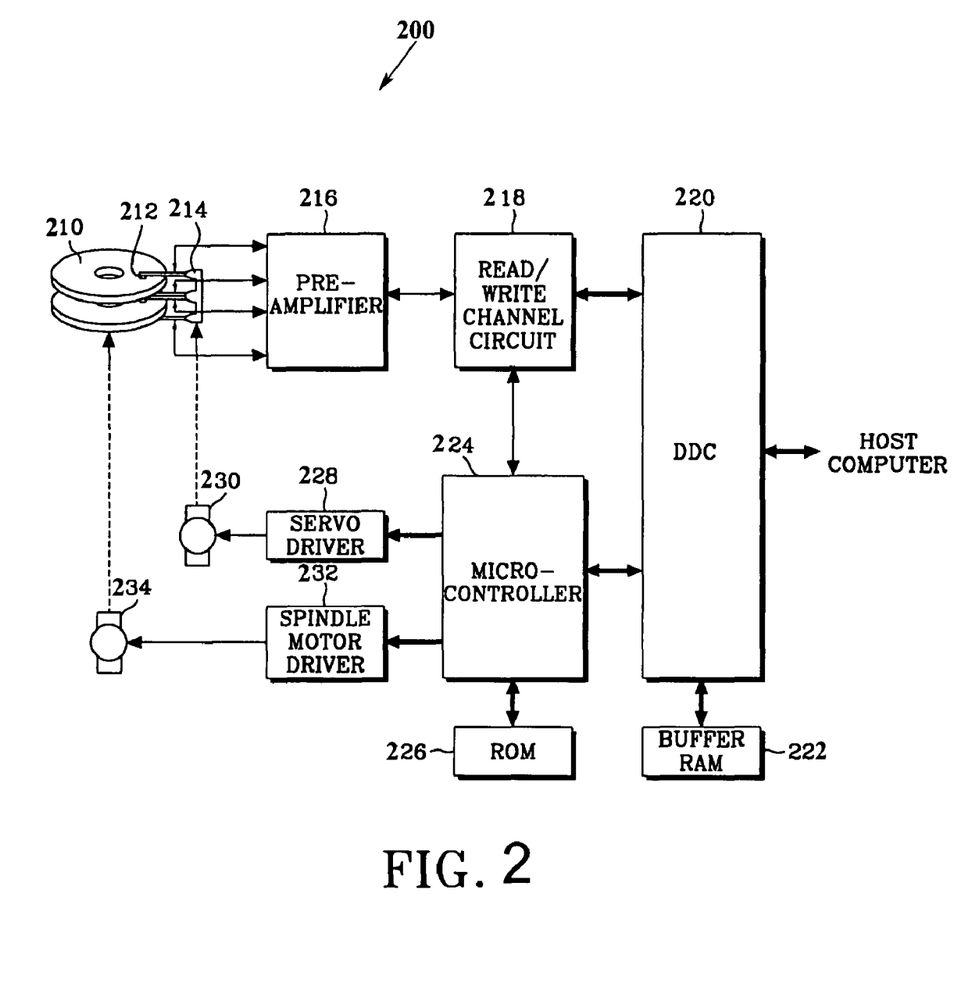
FIG. 2 is a block diagram of a magnetic disk drive device according to an embodiment of the present invention.

FIG. 2 is a block diagram of a magnetic disk drive device 200 according to an embodiment of the present invention. In FIG. 2, disks 210 are rotated by a spindle motor 234, and heads 212 are positioned at surfaces of corresponding ones of disks 210. Heads 212 are mounted on corresponding servo arms that extend from an E-shaped block assembly 214 to disks 210. Block assembly 214 has an associated rotary voice coil actuator 230 that moves block assembly 214 and thereby changes to positions of heads 212 for reading data from or writing data to a specified position on one or more of disks 210.

A pre-amplifier 216 pre-amplifies a signal picked up by heads 212 and thereby provides read/write channel circuit 218 with an amplified signal during a reading operation. During a write operation, pre-amplifier 216 transfers an encoded write data signal from the read/write channel circuit 218 to heads 212. In a read operation, read/write channel circuit 218 detects a data pulse from a read signal provided by pre-amplifier 216 and decodes the data pulse. Read/write channel circuit 218 transfers the decoded data pulse to a disk data controller (DDC) 20. Furthermore, read/write channel circuit 218 also decodes write data received from the DDC 220 and provides the decoded data to pre-amplifier 216.

DDC 220 both writes data received from a host computer (not shown) onto disks 210, through read/write channel circuit 218 and pre-amplifier 216, and transfers read data from disks 210 to the host computer. DDC 220 also interfaces between the host computer and a microcontroller 224. A buffer RAM (Random Access Memory) 222 temporarily stores data transferred between DDC 220 and the host computer, microcontroller 224, and read/write channel circuit 218. Microcontroller 224 controls track seeking and track following functions in response to read and write commands from the host computer.

A ROM (Read Only Memory) 226 stores a control program for microcontroller 224 as well as various setting values. A servo driver 228 generates a driving current for driving actuator 230 in response to a control signal, generated from microcontroller 224 that provides control of the position of heads 212. The driving current is applied to a voice coil of actuator 230. Actuator 230 positions heads 212 relative to disks 210 in accordance with the direction and amount of the driving current supplied from servo driver 228. A spindle motor driver 232 drives spindle motor 234, which rotates disks 210, in accordance with a control value generated from microcontroller 224 for controlling disks 210.

Figure 3:
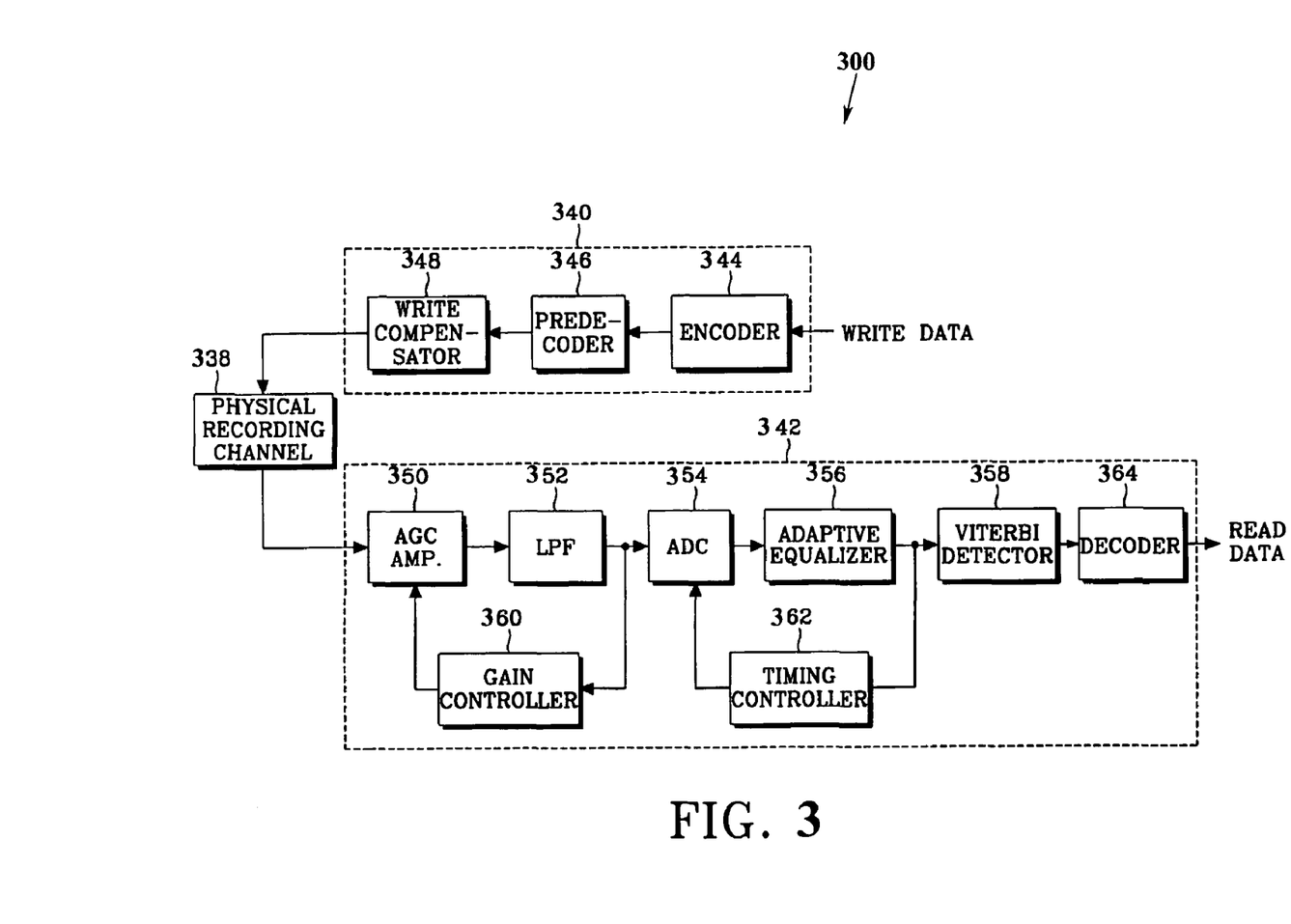
FIG. 3 is a block diagram of a read/write channel circuit of FIG. 2 that employs PRML detection.

FIG. 3 is a block diagram of a read/write channel circuit 300 of FIG. 2 that employs PRML detection. In FIG. 3, the read/write channel circuit 300 includes a physical recording channel 338 having a read/write means and a recording medium, a write channel circuit 340 for writing data onto the recording medium, and a read channel circuit 342 for reading data from the recording medium. Write channel circuit 340 is composed of an encoder 344, a pre-decoder 346, and a write compensator 348. Read channel circuit 342 is composed of an automatic gain control (AGC) amplifier 350, a low pass filter (LPF) 352, an analog-to-digital converter (ADC) 354, an adaptive equalizer 356 that includes a digital filter such as a finite impulse response (FIR) filter, a Viterbi detector 358, a gain controller 360, a timing controller 362, and a decoder 364. The Viterbi detector 358 includes a matched filter (not shown in FIG. 3).

In operation, encoder 344 encodes write data, input to be written onto the recording medium, into a predetermined code. For example, an RLL (Run Length Limited) code, in which the number of adjacent zeros must remain between specified maximum and minimum values, is commonly used for this predetermined code. However, the present invention is not meant to be limited to RLL and other coding may be used. Pre-decoder 346 is included to prevent error propagation. Write compensator 348 reduces non-linear influences arising from the read/write head. However, because the response of the actual recording channel does not exactly coincide with this transfer function, some subsequent equalization is always required.

Automatic gain control (AGC) amplifier 350 amplifies an analog signal read from the disk. Low pass filter 352 removes high frequency noise from and reshapes the signal output from AGC amplifier 350. The signal output from low pass filter 352 is converted into a discrete digital signal by analog-to-digital (A/D) converter 354. The resulting digital signal is then applied to adaptive equalizer 356, which adaptively controls inter-symbol interference (ISI) to generate desired waveforms. Viterbi detector 358 receives the equalized signal output from adaptive equalizer 356 and from it generates encoded data. Decoder 364 decodes the encoded data output from Viterbi detector 358 to generate the final read data. At the same time, in order to correct the analog signal envelope and the digitization sample timing, gain controller 360 controls the gain of AGC amplifier 350 and timing controller 362 controls sample timing for A/D converter 354.

A digital filter, such as implemented in equalizer 356, may be implemented as an analog filter or a digital filter. The parameters of digital filters are generally more stable than the parameters of analog (continuous) filters, primarily because the components of electronic filter change behavior with temperature. Digital filters are either finite impulse response (FIR) or infinite impulse response (EIR), though there are other hybrid classes of filters such as truncated infinite impulse response (TIIR) filters, which show finite impulse responses despite being made from EIR components.

Figure 4:
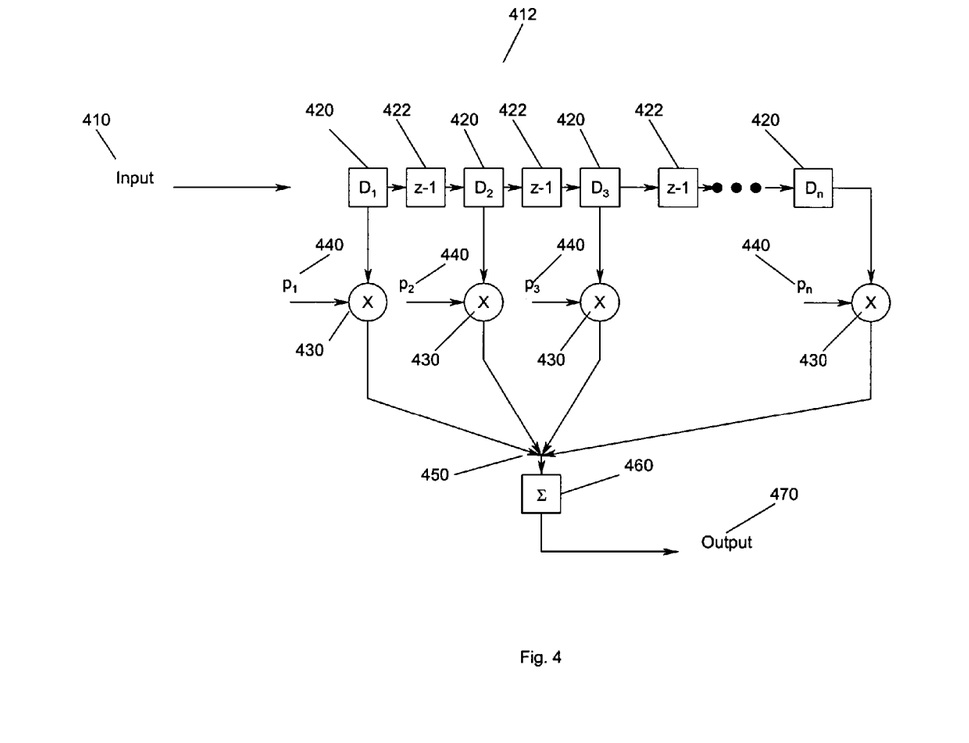
FIG. 4 is a block diagram of a finite impulse response filter for a read channel according to one embodiment of the present invention.

FIG. 4 is a block diagram of a finite impulse response filter 400 for a read channel according to-one embodiment of the present invention. In FIG. 4, an input signal 410 is fed into a circular buffer circuit 412 having a plurality of memory elements 420. A delay block 422 is provided between each stored input 420. Moreover, each stored entity may comprise N-bit data elements. With each successive input to the circular buffer 412, the values of the memory elements 420 are tapped off. The tapped signals may be multiplied 430 by selected coefficients 440. The resulting tapped signals 450 are then added 460 to provide an output 470.

However, those skilled in the art will recognize that the example of filter 400 illustrated in FIG. 4 as part of a read channel is only one possible use according to an embodiment of the present invention, wherein a processor driving the channel operation is provided. Moreover, those skilled in the art will recognize that the present invention is not meant to be limited in any way to a data read channel, but rather there are many other uses for digital filter instruction and filter implementing the filter instruction according to embodiments of the present invention.

A digital filter is implemented using a processor, such as a DSP and an algorithm of well-defined instructions, finite in number, for accomplishing some task which, given a set of inputs, will result in some recognizable end-state. While a digital filter algorithm may be implemented in a DSP, such implementation often takes longer execution times, requires the sizeable code spaces, and has overhead of shifting the data at address x(n−1) to the next higher address in data memory to make certain that the input sequence x(n) is in the correct location for the next pass through the filter. A filter instruction according to an embodiment of the present invention solves these issues using a concise instruction format to significantly decrease memory required, allow for instruction pipelining without branch penalty, and a circular buffer for the data so the data address pointer is only needed to be updated for the next input sample. The filter instruction may be used to implement FIR or IIR filters by using the options of pre-clear accumulator or pre/post storing accumulator results.

Figure 5:
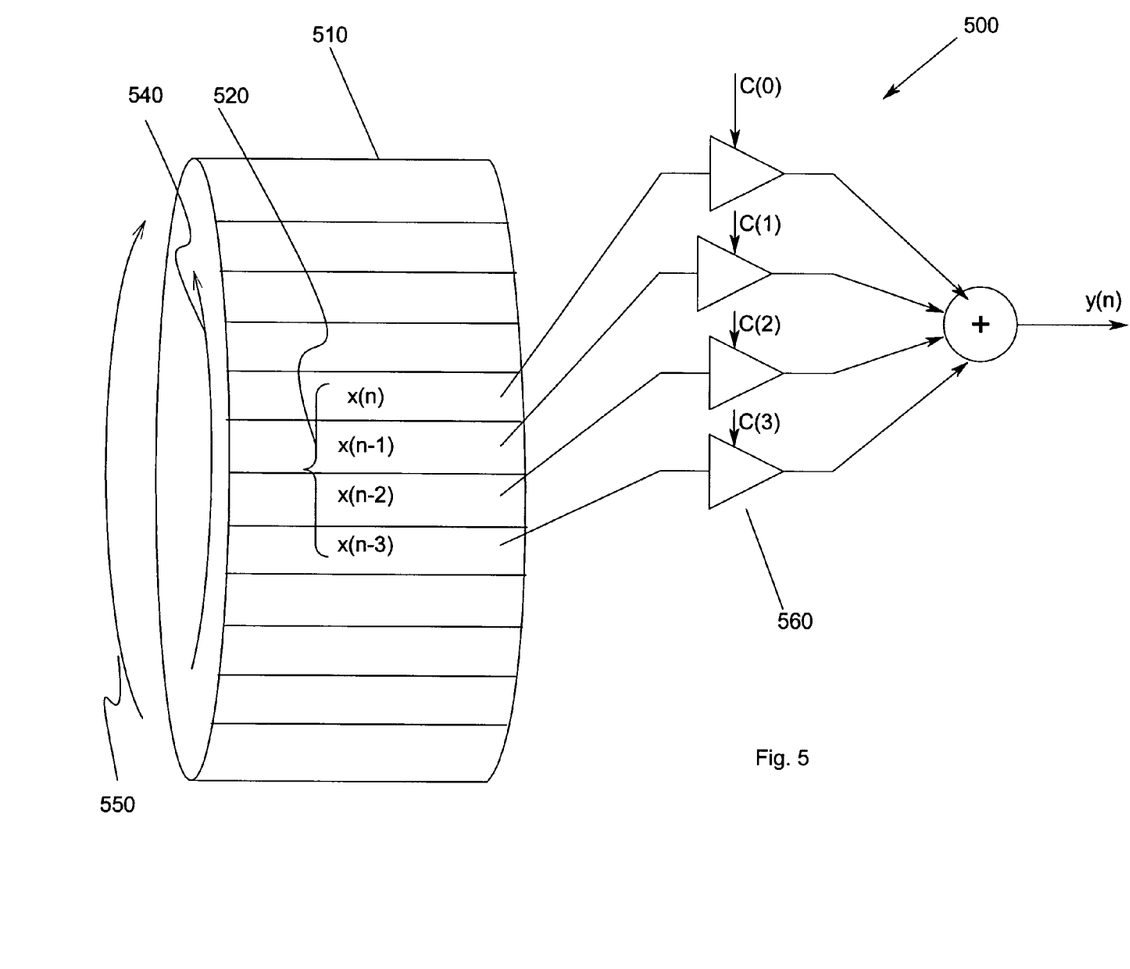
FIG. 5 illustrates a logical block diagram of a FIR filter implemented using a circular buffer according to an embodiment of the present invention.

FIG. 5 illustrates a logical block diagram of a FIR filter 500 implemented using a circular buffer 510 according to an embodiment of the present invention. A DSP performs an instruction according to an embodiment of the present invention to compute the $k^{th}$ filter. The general output of the filter instruction would be:

$$y(n)=c_0*x(n)+c_1*x(n-1)+\ldots c_k*x(n-k),$$

where $c_{0-k}$ are the coefficients, x(n) is the most recent input sample, x(n−k) is the signal sample delayed by k sample periods kT, k is the tap weights, and y(n) is the output. A FIR filter is implementable as a sequence of operations "multiply-and-accumulate," often called MAC. In order to run an $N^{th}$ order FIR filter, at any instant, the current input sample together with the sequence of the N preceding samples must be available. These N samples constitute the memory of the filter. In practical implementations, it is customary to allocate the memory in contiguous cells of the data memory or, in any case, in locations that can be easily accessed sequentially. At every sampling instant, the state must be updated in such a way that x(k) becomes x(k−1), and this seems to imply a shift of N data words in the filter memory. Indeed, instead of moving data, it is convenient to move the indexes that access the data.

In FIG. 5, the memory words 520 are placed in a circular buffer 510. The input is written to the word pointed by the index and the preceding values of the input are read with the preceding values of the index. At every sample instant, the indexes are incremented by one, beginning from location 0 whenever the length M of the buffer is exceeded (this ensures the circularity of the buffer 510). The counterclockwise arrow 540 indicates the direction taken by the indexes, while the clockwise arrow 550 indicates the movement that should be done by the data if the indexes stay in a fixed position. The filter coefficients are provided by the multipliers 560.

Figure 6:
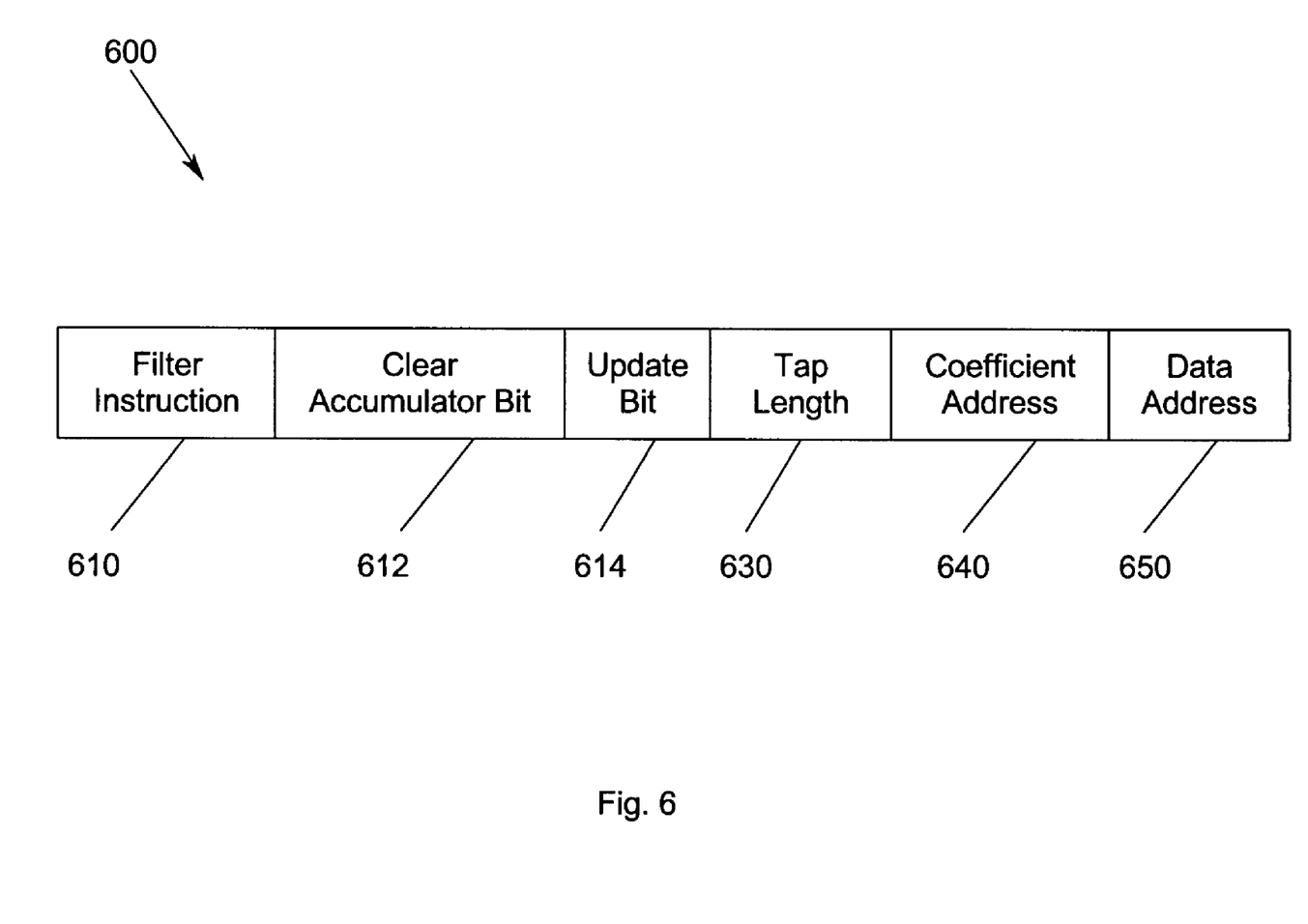
FIG. 6 illustrates the structure of a filter instruction according to an embodiment of the present invention.

FIG. 6 illustrates the structure of a filter instruction 600 according to an embodiment of the present invention. The filter instruction may be realized in a 32-bit instruction format that includes an instruction field 610, a tap length field 630, a coefficient address field 640 and a data header address field 650. The filter instruction 600 also provides clear accumulator bit 612, Ca, which if set, clears the accumulator before filter computation and an update bit 614, Up, which if set, saves the accumulator to the filter table. The tap length field 630 is used to define the number of taps for the filter. The coefficient address 640 provides the coefficient address pointer and the data address field 650 provides the data address pointer. Using the clear accumulator bit "c" 612 and the update bit "u 614," the filter instruction 600 is expanded to four different types. Table 1 illustrates the possible variations of instructions.

TABLE 1

| Instruction | Flags | Description |
| --- | --- | --- |
| Filter | Ca = 0, Up = 0, | Evaluate n tap filter. Leave results in the accumulator. Update the offset at the data header address. |
| Filterc | Ca = 1, Up = 0, | The accumulator is cleared first before n tap filter is evaluated. Update the offset at the data header address. |
| Filteru | Ca = 0, Up = 1, | Evaluate n tap filter. Save a result in the accumulator into a table at the location at (data header address + offset * 4), and update the offset at the data header address. |
| Filtercu | Ca = 1, Up = 1 | The accumulator is cleared first before n tap filter is evaluated. Save a result in the accumulator into a table at (data header address + offset * 4), and update the offset at the data header address. |

Figure 7:
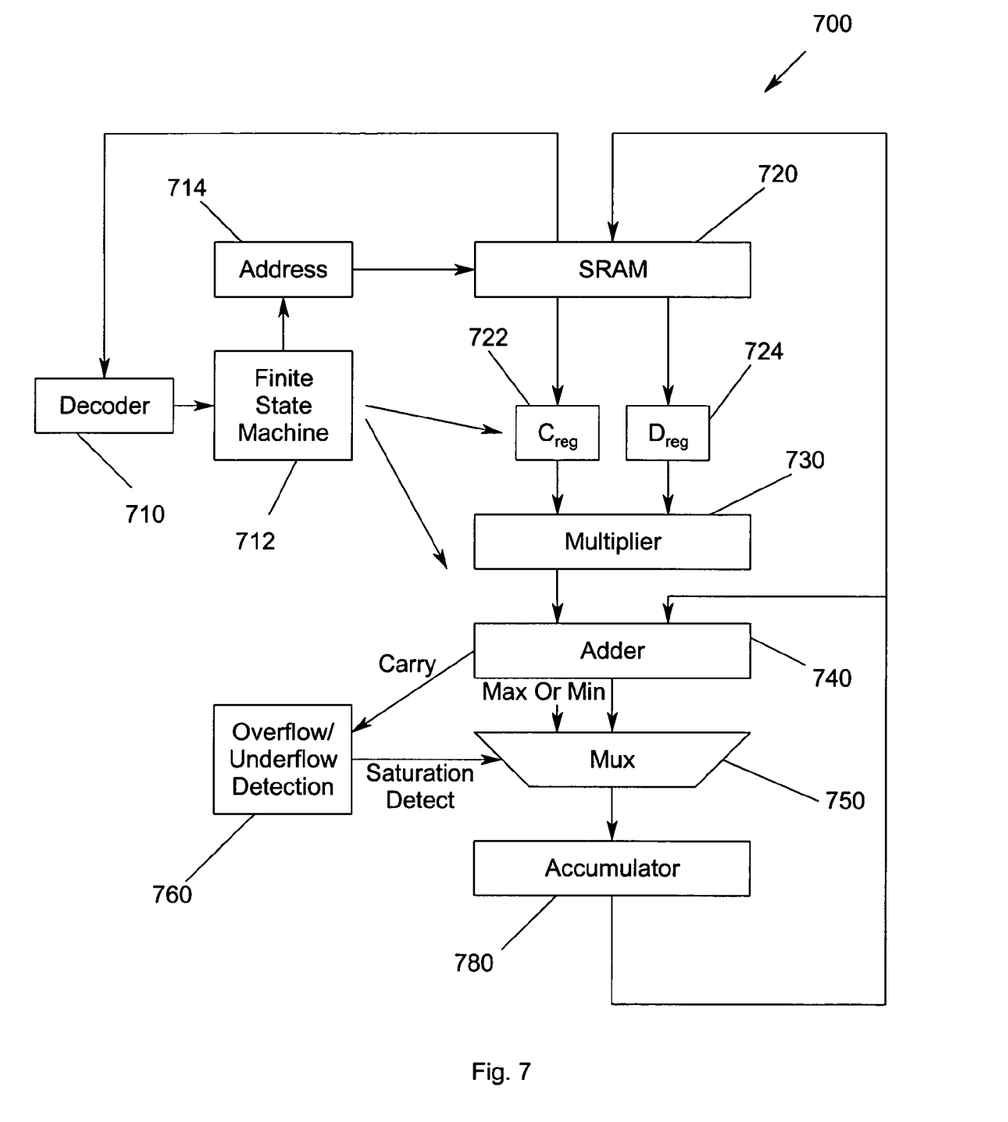
FIG. 7 is a block diagram of a digital filter for processing a filter instruction according an embodiment of the present invention.

FIG. 7 is a block diagram of a digital filter 700 for processing a filter instruction according an embodiment of the present invention. With a filter instruction according an embodiment of the present invention digital filters, such as FIR and IIR filters, are easily coded in one or two filter instructions. The code spaces are reduced as well as the performance is enhanced than the conventional way of coding filters using the simple RISC type instructions. The function of the filter is evaluating the summation of x(n)* a+x(n−1)*b+x(n−2)*c+ . . . , where x(n), x(n−1), x(n−2) are inputs sampled at the time n, n−1, n−2, and the coefficients a, b, c. These inputs and coefficients are stored in a table in such a way that it makes filter evaluation easily. When the overflow and the underflow are detected, the output is saturated to the maximum, or minimum, respectively.

To begin a filter instruction is fetched. The filter instruction is decoded by the decoder 710. When the filter instruction is detected, the finite state machine (FSM) 712 is enabled. The FSM 712 controls the dataflow of the filter engine. First, the FSM 712 loads the address buffer 714 with the coefficient address to the coefficient address pointer and the offset at the data header address to the data pointer. The FSM maintains the number of taps to an adder. An adder is pre-decremented before execution. If the flag "Ca" is set, the accumulator 780 is cleared first.

The operands (coefficients) and sample x(n)) are fetched from the accumulator 780 and loaded into the $C_{reg}$, 722 and the $D_{reg}$ 724, respectively. The multiplier 730 multiplies the contents of $C_{reg}$ 722 and $D_{reg}$ 724. The product from the multiplier 730 and the contents from the accumulator 780 are added by the adder 740. The adder 740 may, for example, be implemented as 32 bit, 48 bit, or 64 bit adder. The new result of the adder 740 is provided to a multiplexor 750. An overflow/underflow detector 760 is provided. If the overflow or the underflow is detected, the maximum or the minimum is provided to the multiplexor 750. The multiplexor 750 provides the accumulator 780 the maximum, the minimum or the value from the adder 740. Then, the FSM 712 decrements the counter and increments the coefficient pointer and data pointer. The data pointer wraps to "1" when it is greater than n tap. The process is repeated until the counter is zero. Then the evaluation of the filter is completed. When the flag "Up" set, the new data offset is saved at the data header address.

Memory may be implemented using, for example, a static random access memory (SRAM) 720. The SRAM 720 can be implemented in a single port SRAM, a three port SRAM (two read ports, one write port), two separate SRAMs (coefficient SRAM, data SRAM) depending upon your application. Either a three port SRAM or two SRAMs are considered for the best performance. The coefficient and data may, for example, be either 16 bit or 32 bit wide depending on application and the arithmetic resolution. The SRAM 720 has a single cycle access. The multipliers 730 may be implemented as a single cycle or as a multi-cycle pipeline multiplier for area/speed depending on the application. For example, the multiplier may be a 16×16, 32×16, or 32×32 multiplier.

Upon the completion of the instruction, the header of the address buffer 714 is updated with new offset that points to the next entry for the new input sample to be stored. The entire computation and updating the data pointer are done without any branch penalty. In a loop form, the digital filter has to constantly test if the hoop has been completed, otherwise a branch is taken and multiply/add is performed.

An instruction according to an embodiment of the present invention allows the results to remain in the accumulator 780 in case of computing for FIR filter or store the results back into the $D_{reg}$ 724 in case of computing IIR filter.

For example, a filter implemented according to an embodiment of the present invention may operate as follows. At time=0, the data buffer includes 4 tap weights, a coefficient address of 0x010, a data header address of 0x068 containing the offset. The offset from the data header indicates where the latest sample, x(n), will be stored and/or where the latest Filter output will be stored. Table 2 illustrates the content of the buffer.

TABLE 2

| Coefficients Addr | Coefficients | Data header Addr | now (t = 0), contents | after, contents |
|---|---|---|---|---|
| 0x010 | c(0) | 0x068, offset | 3 | 2 |
| 0x014 | c(1) | 0x06c, offset = 1 | x(n − 2) | x(n − 2) |
| 0x018 | c(2) | 0x070, offset = 2 | x(n − 3) | x(n − 3) |
| 0x01C | c(3) | 0x074, offset = 3 | x(n) | x(n) |
| | | 0x078, offset = 4 | x(n − 1) | x(n − 1) |

An instruction format according to an embodiment of the present invention may be:

Filter tap_weight=4, coef_addr=0x010, data_header=0x068, c=0, u=0. The execution of the filter instruction begins with the calculation of the tap weight. The tap is equal to tap_weight −1, wherein the tap is now equal to 3 If c is equal to 1, then the accumulator is less than or equal to 0. Thus, the accumulator is less than or equal to 0. The coefficient address is set per the instruction to be 0x010. The data offset is less than equal to the value stored at the data header, i.e., the data offset is equal to 3. The digital signal processor implementing the filter then loads the coefficients, c(3), into the $C_{reg}$. The data, x(3) is loaded in the $D_{reg}$. The multiplication of $C_{reg}$ and $D_{reg}$ is performed and the product is added to the accumulator value. The new result is saved into the accumulator register. This is repeated until the most recent value, c(0) and x(0), are processed.

The latest sample, x(n), may be stored to data buffer by using the store indirect instruction. To store x(n) at the data header address (0x068)+offset*4; i.e., the data header address will be 0x074, the filter instruction is:

Filterc n-tap, coefficient address, data header address.
For n=4 and t=time, the FIR results remain in the accumulator and X=c(0)*x(4)+c(1)*x(3)+c(2)*x(2)+c(3)*x(1). The contents of the buffer are represented in Table 3.

TABLE 3

| coef addr0 | coef | data addr0 | T = 0 | t = 1 | t = 2 | t = 3 | t = 4 | t = 5 |
|---|---|---|---|---|---|---|---|---|
| 0x000 | c(0) | 0x200 | offset = 1 | Offset = 4 | offset = 3 | offset = 2 | Offset = 1 | offset = 4 |
| 0x004 | c(1) | 0x204 | X(n) | x(n − 1) | x(n − 2) | x(n − 3) | x(n) | x(n − 1) |
| 0x008 | c(2) | 0x208 | 0 | 0 | 0 | x(n) | x(n − 1) | x(n − 2) |
| 0x00c | c(3) | 0x20c | 0 | 0 | x(n) | x(n − 1) | x(n − 2) | x(n − 3) |
| | | 0x210 | 0 | x(n) | x(n − 1) | x(n − 2) | x(n − 3) | x(n) |

The data buffer is then updated with the latest y(n) at the location, data header addr+offset*4. The contents of a buffer for an IIR filter are shown in Table 4.

TABLE 4

| coef addr1 | coef | data addr1 | t = 0 | T = 1 | t = 2 | t = 3 | t = 4 | t = 5 |
|---|---|---|---|---|---|---|---|---|
| 0x010 | b(0) | 0x214 | offset = 1 | offset = 4 | offset = 3 | offset = 2 | offset = 1 | offset = 4 |
| 0x014 | b(1) | 0x218 | y(n) = X | y(n − 1) | y(n − 2) | y(n − 3) | y(n) | y(n − 1) |
| 0x018 | b(2) | 0x21c | 0 | 0 | 0 | y(n) | y(n − 1) | y(n − 2) |
| 0x01c | b(3) | 0x220 | 0 | 0 | y(n) | y(n − 1) | y(n − 2) | y(n − 3) |
| | | 0x224 | 0 | y(n) | y(n − 1) | y(n − 2) | y(n − 3) | y(n) |

The sampled inputs and the filter coefficients are loaded into SRAM as shown in Table 5.

TABLE 5

| Description | Address | SRAM Contents |
|---|---|---|
| Data header pointer ==> | 0x0010 | Offset = 2 |
| | 0x0014 | X(n − 2) |
| | 0x0018 | X(n) |
| | 0x001C | X(n − 1) |
| | ... | ... |
| Coefficient pointer | 0x0100 | C0 |
| | 0x0102 | C1 |
| | 0x0104 | C2 |

The new samples are loaded into the table in a circular fashion. The location for the new sample, x(n), is determined by the summation of the data header address and the offset*4, which is 0x0018. The offset always points to the oldest sample, which is replaced by the incoming sample x(n). After the filter instruction is executed, the offset is updated to "1." The filter instruction is coded as follows.

Filtercu tap=4, coef addr=0x000, data_header=0x100

For a 4 tap filter: Y(n)=c0*x(n)+c1*x(n−1)+c2*x(n−2)+c3*x(n−3) and the SRAM contents are shown in Table 6.

TABLE 6

| Description | Address | SRAM contents |
|---|---|---|
| Coefficient pointer ==> | 0x000 | C0 |
| | 0x002 | C1 |
| | 0x004 | C2 |
| | 0x006 | C3 |
| Data header ==> | 0x100 | 3 |
| | 0x104 | X(n − 2) |
| | 0x108 | X(n − 3) |
| | 0x10C | X(n) |
| | 0x110 | X(n − 1) |

In a filter using two SRAMs according to an embodiment of the present invention, two SRAMs are used for coefficients and data respectively. One cycle multiplier is used. In the first cycle, a counter is set to the equal the number of taps. The coefficient pointer is set to the coefficient address. The data pointer is set to the offset at the data header address. The coefficient and data are fetched from the SRAMs. The data address is set to equal the data header address plus the offset.

The coefficient and data are fetched and the coefficient pointer and data pointer are post incremented. The accumulator register is cleared.

In the second cycle, the coefficient and data are loaded in the $C_{reg}$ and $D_{reg}$. For example, the $C_{reg}$ contains c(0) and the $D_{reg}$ contains x(n). The accumulator is updated to contain the product of $C_{reg}$ and $D_{reg}$ plus the previous value of the accumulator, which is zero in this cycle. If the overflow/underflow occurs, the accumulator is saturated to Max/Min value. The counter value is decremented and checked to determine if the counter is equal to 0. If the counter is equal to 0, the process jumps to the final cycle. Otherwise, the process continues to the next operation. The coefficient and data are fetched and the coefficient pointer and data pointer are post incremented. If the data pointer is equal to the number of taps, the data pointer is set to 3.

In the third cycle, the coefficient and data are loaded in the $C_{reg}$ and $D_{reg}$. For example, the $C_{reg}$ contains c(1) and the $D_{reg}$ contains x(n−1). The accumulator is updated to contain the product of $C_{reg}$ and $D_{reg}$ plus the previous value of the accumulator. If the overflow/underflow occurs, the accumulator is saturated to Max/Min value. The counter value is decremented and checked to determine if the counter is equal to 0. If the counter is equal to 0, the process jumps to the final cycle. Otherwise, the process continues to the next operation. The coefficient and data are fetched and the coefficient pointer and data pointer are post incremented. If the data pointer is equal to the number of taps, the data pointer is set to 2.

In the fourth cycle, the coefficient and data are loaded in the $C_{reg}$ and $D_{reg}$. For example, the $C_{reg}$ contains c(2) and the $D_{reg}$ contains x(n−2). The accumulator is updated to contain the product of $C_{reg}$ and $D_{reg}$ plus the previous value of the accumulator. If the overflow/underflow occurs, the accumulator is saturated to Max/Min value. The counter value is decremented and checked to determine if the counter is equal to 0. If the counter is equal to 0, the process jumps to the final cycle. Otherwise, the process continues to the next operation. The coefficient and data are fetched and the coefficient pointer and data pointer are post incremented. If the data pointer is equal to the number of taps, the data pointer is set to 1.

In the fifth cycle, the coefficient and data are loaded in the $C_{reg}$ and $D_{reg}$. For example, the $C_{reg}$ and $D_{reg}$ contains c(3) and the $C_{reg}$ and $D_{reg}$ contains x(n−3). The accumulator is updated to contain the product of $C_{reg}$ and $D_{reg}$ plus the previous value of the accumulator. If the overflow/underflow occurs, the accumulator is saturated to Max/Min value. The counter value is decremented and checked to determine if the counter is equal to 0. If the counter is equal to 0, the process jumps to the final cycle, which is this case the counter is equal to zero.

In the final cycle, the new offset at the data header address is saved. If Up is equal to 1, the accumulator value at the data header address plus the offset of 4 is saved. Thus, a filter instruction according to an embodiment of the present invention solves these issues with a concise instruction format to significantly decrease memory required, allow for instruction pipelining without branch penalty, and uses the circular buffer for the data so the data address pointer is only needed to be updated for the next input sample. The filter instruction may be used to implement FIR or IIR filters by using the options of pre/post clear accumulator or pre/post storing accumulator results.

The process illustrated with reference to FIGS. 1-7 may be tangibly embodied in a computer-readable medium or carrier, e.g. one or more of the fixed and/or removable data storage devices 188 illustrated in FIG. 1, or other data storage or data communications devices. The computer program 190 may be loaded into memory 170 to configure the processor 172 for execution of the computer program 190. The computer program 190 include instructions which, when read and executed by a processor 172 of FIG. 1, causes the devices to perform the steps necessary to execute the steps or elements of an embodiment of the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A filter instruction for synthesizing a digital filter, wherein the filter instruction is executed by a machine, the filter instruction residing in memory and comprises an instruction field, a tap length field, a coefficient address field, a data header address field, a clear accumulator bit and an update bit, wherein the clear accumulator bit instructs the machine to clear the accumulator before filter computation when set, the update bit instructs the machine to save an accumulated value to a filter table when set, the tap length field defines the number of taps for the filter, the coefficient address field provides the coefficient address pointer and the data header address field provides the data address pointer, the filter instruction operative on a portion of the memory implemented as a circular buffer storing each of the coefficients and data input sample, the circular buffer requiring updating of only the coefficient address field and data header address field provided by the filter instruction for each data input sample passed through the filter.

2. The filter instruction of claim 1, wherein the fields designate memory locations in the circular buffer.

3. The filter instruction of claim 1, wherein the clear accumulator bit is used for clearing a memory location storing an accumulated value before filter computation.

4. The filter instruction of claim 1, wherein the update bit is used for saving the accumulator value in a memory location for storing an accumulated value.

5. The filter instruction of claim 1, wherein the filter instruction provides for moving pointers used by the machine to access the data input samples and not moving the data input samples.

6. The filter instruction of claim 1, wherein the pointer to the data header address field is incremented by one until a length of the circular buffer defined by the tap length field is exceeded, wherein the pointer moves to a beginning address whenever the length of the circular buffer is exceeded.

7. The filter instruction of claim 1, wherein the clear accumulator bit and update bit defines one of four types of filter instructions, and wherein the clear accumulator bit comprises a first and second value and the update bit comprises a first and second value.

8. The filter instruction of claim 7, wherein the filter instruction instructs the machine to evaluate an n tap filter, to save results in an accumulator and to update the offset at the data header address when the clear accumulator bit is set to the first value and the update bit is set to the first value.

9. The filter instruction of claim 7, wherein the filter instruction clears the accumulator before an n tap filter is evaluated and updates the offset at the data header address when the clear accumulator bit is set to the second value and the update bit is set to the first value.

10. The filter instruction of claim 7, wherein the filter instruction evaluates an n tap filter, saves a result in the accumulator into a table at a location based on the data header address and updates an offset at the data header address when the clear accumulator bit is set to the first value and the update bit is set to the second value.

11. The filter instruction of claim 7, wherein the filter instruction clears the accumulator before an n tap filter is evaluated, saves a result from the accumulator into a table and updates the offset at the data header address when the clear accumulator bit is set to the second value and the update bit is set to the second value.

12. The filter instruction of claim 1, wherein the filter instruction causes the sum of the data values and corresponding coefficient values to be stored in an accumulator memory location.

13. The filter instruction of claim 1, wherein the filter instruction updates a header of a circular buffer with a new offset which points to a next entry for a new input sample to be stored, the computation and updating of the data pointer being performed without a branch penalty.

14. An apparatus comprising:
a processor having registers, the processor configured to implement a digital filter;
a filter instruction executable on the processor to implement the digital filter, the filter instruction comprising an instruction field, a tap length field, a coefficient address field, a data header address field, a clear accumulator bit and an update bit; and
addressable memory coupled to the processor for storing filter parameters for implementing the digital filter by the processor based on the filter instruction;
wherein the clear accumulator bit instructs the machine to clear the accumulator before filter computation when set, the update bit instructs the processor to save an accumulated value to a filter table when set, the tap length field defines the number of taps for the digital filter, the coefficient address field provides the coefficient address pointer in the addressable memory and the data header address field provides the data address pointer in the addressable memory, the processor operating on the filter instruction to manipulate a portion of the memory implemented as a circular buffer storing each of the coefficients and data input sample, the circular buffer requiring updating of only coefficient address field and the data header address field provided by the filter instruction for each data input sample passed through the filter.

15. The apparatus of claim 14, wherein the fields designate memory locations in the circular buffer.

16. The apparatus of claim 14, wherein the clear accumulator bit is used for clearing a memory location storing an accumulated value before filter computation.

17. The apparatus of claim 14, wherein the update bit is used for saving the accumulator value in a memory location for storing an accumulated value.

18. The apparatus of claim 14, wherein the filter instruction provides for moving pointers used by the processor to access the data input samples and not moving the data input samples.

19. The apparatus of claim 14, wherein the pointer to the data header address field is incremented by one until a length of the circular buffer defined by the tap length field is exceeded, wherein the pointer moves to a beginning address whenever the length of the circular buffer is exceeded.

20. The apparatus of claim 14, wherein the clear accumulator bit and update bit defines one of four types of filter instructions, and wherein the clear accumulator bit comprises a first and second value and the update bit comprises a first and second value.

21. The apparatus of claim 20, wherein the filter instruction instructs the processor to evaluate an n tap filter, to save results in an accumulator and to update the offset at the data header address when the clear accumulator bit is set to the first value and the update bit is set to the first value.

22. The apparatus of claim 20, wherein the filter instruction clears the accumulator before an n tap filter is evaluated and updates the offset at the data header address when the clear accumulator bit is set to the second value and the update bit is set to the first value.

23. The apparatus of claim 20, wherein the filter instruction evaluates an n tap filter, saves a result in the accumulator into a table at a location based on the data header address and updates an offset at the data header address when the clear accumulator bit is set to the first value and the update bit is set to the second value.

24. The apparatus of claim 20, wherein the filter instruction clears the accumulator before an n tap filter is evaluated, saves a result from the accumulator into a table and updates the offset at the data header address when the clear accumulator bit is set to the second value and the update bit is set to the second value.

25. The apparatus of claim 14, wherein the filter instruction causes the sum of the data values and corresponding coefficient values to be stored in an accumulator memory location.

26. The apparatus of claim 14, wherein the filter instruction updates a header of a circular buffer with a new offset which points to a next entry for a new input sample to be stored, the computation and updating of the data pointer being performed without a branch penalty.

27. A magnetic storage device, comprising:
a magnetic storage medium for recording data thereon;
a motor for moving the magnetic storage medium;
a head for reading and writing data on the magnetic storage medium;
an actuator for positioning the head relative to the magnetic storage medium; and
a data channel for processing encoded signals on the magnetic storage medium, the data channel comprising:
a processor having registers, the processor configured to implement a digital filter;
a filter instruction executable on the processor to implement the digital filter, the filter instruction comprising an instruction field, a tap length field, a coefficient address field, a data header address field, a clear accumulator bit and an update bit; and
addressable memory coupled to the processor for storing filter parameters for implementing the digital filter by the processor based on the filter instruction;
wherein the clear accumulator bit instructs the machine to clear the accumulator before filter computation when set, the update bit instructs the processor to save an accumulated value to a filter table when set, the tap length field defines the number of taps for the digital filter, the coefficient address field provides the coefficient address pointer in the addressable memory and the data header address field provides the data address pointer in the addressable memory, the processor operating on the filter instruction to manipulate a portion of the memory implemented as a circular buffer storing each of the coefficients and data input sample, the circular buffer requiring updating of only coefficient address field and the data header address field provided by the filter instruction for each data input sample passed through the filter.

28. The magnetic storage device of claim 27, wherein the fields designate memory locations in the circular buffer.

29. The magnetic storage device of claim 27, wherein the clear accumulator bit is used for clearing a memory location storing an accumulated value before filter computation.

30. The magnetic storage device of claim 27, wherein the update bit is used for saving the accumulator value in a memory location for storing an accumulated value.

31. The magnetic storage device of claim 27, wherein the filter instruction provides for moving pointers used by the processor to access the data input samples and not moving the data input samples.

32. The magnetic storage device of claim 27, wherein the pointer to the data header address field is incremented by one until a length of the circular buffer defined by the tap length field is exceeded, wherein the pointer moves to a beginning address whenever the length of the circular buffer is exceeded.

33. The magnetic storage device of claim 27, wherein the clear accumulator bit and update bit defines one of four types of filter instructions, and wherein the clear accumulator bit comprises a first and second value and the update bit comprises a first and second value.

34. The magnetic storage device of claim 33, wherein the filter instruction instructs the processor to evaluate an n tap filter, to save results in an accumulator and to update the offset at the data header address when the clear accumulator bit is set to the first value and the update bit is set to the first value.

35. The magnetic storage device of claim 33, wherein the filter instruction clears the accumulator before an n tap filter is evaluated and updates the offset at the data header address when the clear accumulator bit is set to the second value and the update bit is set to the first value.

36. The magnetic storage device of claim 33, wherein the filter instruction evaluates an n tap filter, saves a result in the accumulator into a table at a location based on the data header address and updates an offset at the data header address when the clear accumulator bit is set to the first value and the update bit is set to the second value.

37. The magnetic storage device of claim 33, wherein the filter instruction clears the accumulator before an n tap filter is evaluated, saves a result from the accumulator into a table and updates the offset at the data header address when the clear accumulator bit is set to the second value and the update bit is set to the second value.

38. The magnetic storage device of claim 27, wherein the filter instruction causes the sum of the data values and corresponding coefficient values to be stored in an accumulator memory location.

39. The magnetic storage device of claim 27, wherein the filter instruction updates a header of a circular buffer with a new offset which points to a next entry for a new input sample to be stored, the computation and updating of the data pointer being performed without a branch penalty.

* * * * *